United States Patent [19]
Blonder et al.

[11] Patent Number: 5,834,709
[45] Date of Patent: *Nov. 10, 1998

[54] POSITION SENSING SYSTEMS INCLUDING MAGNETORESISTIVE ELEMENTS

[75] Inventors: Greg E. Blonder, Summit; Robert Albert Boie, Westfield; Sungho Jin, Millington; Mark Thomas McCormack, Summit, all of N.J.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 234,528

[22] Filed: Apr. 28, 1994

Related U.S. Application Data

[63] Continuation-in-part of Ser. No. 187,668, Jan. 26, 1994, Pat. No. 5,411,814.

[51] Int. Cl.$^6$ .................................................. G08C 21/00
[52] U.S. Cl. .................................... 178/18.05; 178/18.01
[58] Field of Search ........................... 178/18, 19, 18.01, 178/18.05; 324/207.21, 252, 260; 338/32 R; 252/62.57, 62.63; 360/113; 428/692, 694 R

[56] References Cited

U.S. PATENT DOCUMENTS

| | | | |
|---|---|---|---|
| 4,499,138 | 2/1985 | Yamomoto | 428/216 |
| 4,697,050 | 9/1987 | Farel et al. | 178/18 |
| 4,777,553 | 10/1988 | Aoi et al. | 360/114 |
| 4,853,493 | 8/1989 | Schlosser et al. | 178/18 |
| 4,952,757 | 8/1990 | Purcell et al. | 178/19 |
| 4,996,392 | 2/1991 | Tagawa | 178/18 |
| 4,999,462 | 3/1991 | Purcell | 178/19 |
| 5,113,041 | 5/1992 | Blonder et al. | 178/18 |
| 5,243,317 | 9/1993 | Chen et al. | 338/92 |
| 5,411,814 | 5/1995 | Jin et al. | 428/692 |
| 5,474,624 | 12/1995 | Suzuki et al. | 148/121 |
| 5,484,545 | 1/1996 | Hayashi et al. | 252/62.58 |

FOREIGN PATENT DOCUMENTS

| | | |
|---|---|---|
| B-11 37 507 | 5/1959 | Denmark . |
| A-24 15 250 | 3/1974 | Denmark . |
| A-0 283 687 | 3/1987 | European Pat. Off. .......... G01B 7/03 |
| WO 93/09529 | 5/1993 | WIPO .............................. G09G 3/00 |

OTHER PUBLICATIONS

D. J. Grover, "Graphics Tablets—A Review," *Displays*, vol. 1, No. 2, Jul. 1979.
J. Heremans, "Solid State Magnetic Field Sensors and Applications," *J. Phys. D: Appl. Phys.*, vol. 26, p. 1149 (1993).
U. Dibbern et al., "The Magnetoresistive Sensor—A Sensitive Device for Detecting Magnetic Field Variations," *Electronic Components and Applications*, vol. 5, No. 3, p. 148 (1983).
P. M. Levy, "Giant Magnetoresistance in Magnetic Layered and Granular Materials," *Science*, vol. 256, p. 972 (1992).
E. F. Fullerton, "150% Magnetoresistance in Sputtered Fe/Cr(100) Superlattices," *Appl. Phys. Letts.*, vol. 63, No. 12, p. 1699 (1993).
T. L. Hylton, "Giant Magnetoresistance at Low Fields in Disontinuous NiFe–Ag Multilayer Thin Films," *Science*, vol. 265, p. 1021 (1993).
R. Von Helmolt et al "Giant Negative Magnetoresistance in Perovskitelike La2/3Ba1/3MnoxFerromagnetic Films" *Physical Review Letters* vol. 71, No. 14, pp. 2331–2332 (1993).

*Primary Examiner*—Don N. Vo
*Attorney, Agent, or Firm*—Margaret A. Burke; Glen E. Books

[57] ABSTRACT

The present invention provides a position-sensing system which employs sensors incorporating magnetoresistive materials. The position of a magnetic information input member is determined through the resistance change of the magnetoresistive sensor in response to the magnetic field from the magnetic information input member. Exemplary magnetoresistive materials are lanthanum manganites having high magnetoresistive ratios. Two-dimensional position sensing systems for graphics tablets are also described.

14 Claims, 3 Drawing Sheets

POSITION SENSING SYSTEMS INCLUDING MAGNETORESISTIVE ELEMENTS

CROSS-REFERENCES TO RELATED APPLICATIONS

This invention is a continuation-in-part of U.S. patent application Ser. No. 08/187,668 entitled Article Comprising Magnetoresistive Oxide Of La, Ca, Mn Additionally Containing Either Or Both Of Sr And Ba, filed on Jan. 26, 1994 in the names of Sungho Jin, Mark Thomas McCormack and Thomas Henry Tiefel. Ser. No. 08/187,668 issued as U.S. Pat. No. 5,411,814 on May 2, 1995.

BACKGROUND OF THE INVENTION

1. Field of the Invention

The present invention relates to position-sensing systems which include magnetoresistive elements and, more particularly, to x-y position-sensing systems such as graphics tablets incorporating arrays of magnetoresistive sensing elements to determine the location of a magnetic information input member.

2. Description of the Related Art

Various devices employ position sensors that detect the location of an information input member. For example, graphics tablets require x-y position sensors to determine the position of a hand-held writing instrument. Known position sensing techniques include voltage/current division on a resistive sheet, sonic digitizers, piezoelectric systems, magnetostrictive methods, optical tablets, magnetic induction techniques, and capacitive processes. Various position sensing methods and systems are reviewed by D. J. Grover, "Graphics Tablets—A Review," Displays, Vol. 1, No. 2, July 1979, allowed U.S. application Ser. No. 07/861,667 filed Apr. 1, 1992, to Boie et. al., and U.S. Pat. No. 5,113,041 issued May 12, 1992, to Blonder et al., the disclosures of which are incorporated herein by reference.

However, many current magnetic position-sensing techniques employ position-sensing elements whose output characteristics, e.g., voltage or resistance, change as a function of the speed of the information input member. For example, in graphics tablets which employ inductive sensing of a moving magnetic pen by $d\phi/dt$ voltage generation, the magnitude of the voltage change is dependent upon the speed with which the magnetic pen is moved.

Magnetoresistive materials, i.e., those materials whose resistance changes in the presence of a magnetic field, have been employed for position-sensing applications. The characteristics and applications of magnetoresistive sensors are described by J. Hermans in "Solid State Magnetic Field Sensors and Applications," *J. Phys. D: App. Phys.*, Vol. 26, p. 1149 (1993), and by U. Dibbern and A. Peterson, "The Magnetoresistive Sensor—A Sensitive Device for Detecting Magnetic Field Variations," *Electronic Components and Applications*, Vol. 5, No. 3, p. 148 (1983), the disclosures of which are incorporated by reference. Linear and angular position sensors using magnetoresistive materials are described.

The magnetoresistance (MR) of a material is the resistance, $R(H)$ of the material in an applied magnetic field, H, minus the resistance of the material, $R_o$, in the absence of an applied magnetic field. This difference is typically divided by $R(H)$ and expressed as a magnetoresistance ratio given as a percentage:

$$MR\ Ratio = (R(H) - R_o)/R(H).$$

Conventional metallic magnetoresistive materials, e.g., PERMALLOY® nickel/iron alloy, typically have a positive MR ratio of a few percent. Larger MR ratios have been observed in metallic multilayer structures such as iron/chromium and copper/cobalt multilayer structures. See, for instance, P. M. Levy, *Science*, Vol. 256, p. 972 (1992), E. F. Fullerton, *Applied Physics Letters*, Vol. 63, p. 1699 (1993), and T. L. Hylton, *Science*, Vol. 265, p. 1021 (1993), the disclosures of which are incorporated by reference herein.

There is a need in the art for improved position-sensing systems, particularly, magnetic position-sensing systems incorporating position-sensing elements incorporating magnetoresistive materials having relatively high changes in resistance in the presence of a magnetic field. Such improved position-sensing systems could be incorporated into sensitive devices which simply and accurately record the position of an information input member.

SUMMARY OF THE INVENTION

The present invention provides a position-sensing system which employs magnetoresistive sensing elements whose resistance changes in the presence of an applied magnetic field. The position-sensing system includes an information input member which incorporates a magnet. At least one sensing element is provided, the sensing element including a magnetoresistive material. Exemplary magnetoresistive materials are those having magnetoresistive ratios greater than approximately 50% in a magnetic field strength of 6 Tesla, especially those materials whose resistance change, and hence the voltage drop across the material for a given applied voltage, is independent of the rate of change of the magnetic field.

In one embodiment, the magnetoresistive material includes a compound of the form $A_wB_xC_yO_z$ where A is selected from one or more of La, Y, Ce, Nd, Sm, Eu, Tb, Dy, Ho, Er, Tm, Yb, and Lu, B is selected from one or of Mg, Ca, Sr, Ba, Pb, and Cd, and C is selected from Cr, Mn, Fe, and Co and w is 0.4 to 0.9, x is 0.1 to 0.6, y is 0.7 to 1.5, and z is 2.5 to 3.5.

In a further embodiment, the invention provides an x-y position-sensing system, such as a graphics tablet. The x-y position-sensing system includes an information input member, including a magnet. An array of position-sensing elements is provided, the array including a first set of sensing strips. The sensing strips are positioned parallel to each other forming a row which measures position of the information input member in a first direction. A second set of sensing strips forms a row of parallel strips which measures position of the information input member in a second direction, the first and second rows of sensing strips being approximately perpendicular to each other. Each of the sensing strips incorporates a magnetoresistive material. A current is input to the sensing strips and the voltage drop is measured across the sensing strips. The voltage drop changes as the resistance of the magnetoresistive material is altered by the applied magnetic field.

DETAILED DESCRIPTION

Figure 1:
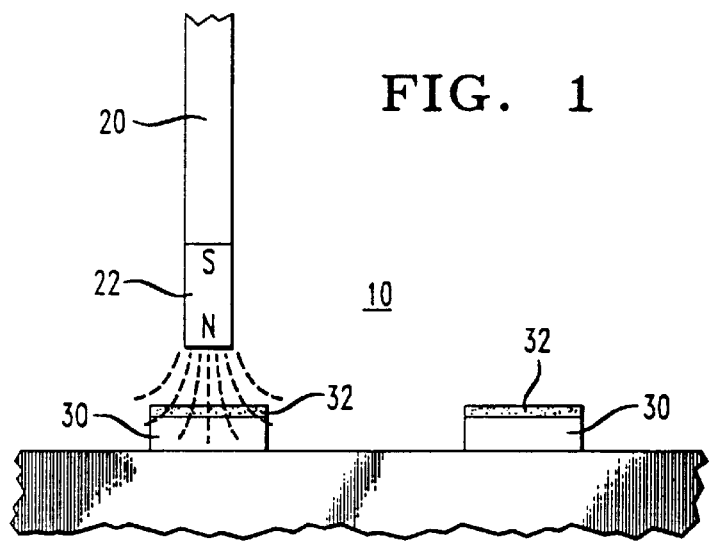
FIG. 1 is a schematic cross-sectional view depicting position-sensing using a magnetic information input member according to one embodiment of the present invention.

Turning now to the drawings in detail, FIG. 1 illustrates a position-sensing system 10 according to one embodiment of the present invention. Position-sensing system 10 includes a magnetic information input member 20 and at least one sensor 30. Magnetic information input member 20 is illustratively a hand-held pen or stylus such as those employed in graphics tablet systems and includes magnet 22 for creating a magnetic field. Magnetic information input member 20 conveys information to the system in terms of its position relative to sensors 30. Magnet 22, selected from permanent magnets, battery-operated DC electromagnets, and AC electromagnets, is positioned within magnetic information input member 20 to create a desired magnetic field orientation. In an exemplary embodiment, magnet 22 is a permanent magnet, freeing input member 20 from current-providing wires or batteries. The use of permanent magnets also permits input member 20 to be inexpensively manufactured and easily replaceable.

The magnitude of the magnetic field can be adjusted through selection of the appropriate magnet for the information input member, as well as by selection of the appropriate geometry of the magnetic element. For example, permanent magnet materials with high energy products generally provide stronger magnetic fields giving higher sensing element signals and wider ranges of field influence which result in easier detection by adjacent sensing elements. Rare-earth cobalt, Nd—Fe—B, and hexaferrite magnets are exemplary permanent magnets for use as magnet 22. For electromagnets, the applied current and core/pole piece geometry and material control the magnetic field strength. The magnetic field strength is also adjustable through the vertical (z-direction) distance between the magnet contained in the information input member and the magnetoresistive sensor, the strength of the magnetic field increasing with decreasing distance. When the position sensing system of the present invention is employed in a graphics tablet, the minimum vertical distance is fixed through the selection of a cover layer and/or spacer of appropriate thickness.

Magnetic information input member 20 optionally includes a magnetic signal generator to serve as an "eraser", for example, placed at the end of the input member opposite magnet 22. For example, a hand-held stylus can include an information input member at one end, and an information delete member at the other end. Alternatively, the eraser can be a separate device from input member 20. The eraser comprises a magnetic field generating element which creates a magnetic field different in nature from that produced by magnet 22. For example, if the field from magnet is D.C., the field from the "eraser" is A.C. and vice versa. Alternatively, both the input and erase magnetic fields can be A.C. but with different frequencies, orientations, or waveforms. The different types of magnetic fields produce correspondingly different changes in the magnetoresistance of the sensors. The sensors' output can then be processed to indicate information input or erase accordingly.

Sensors 30 include magnetoresistive material 32. In an exemplary embodiment, magnetoresistive material 32 is formed as a thin film, although a variety of geometric shapes and configurations can be selected in accordance with the system in which they are used. As the magnetic field created by magnet 22 interacts with sensors 30, the resistance of the magnetoresistive member changes according to the strength of the magnetic field. Since the magnetic field strength is proportional to its distance from the sensor, the change in resistance of each sensor indicates the distance of input member 20 relative to that sensor.

When a current is applied to sensors 30, the change in resistance due to the presence of the input member magnetic field sets up a corresponding change in the voltage according to the relationship $\Delta V = I \Delta R$. The $\Delta V$ signal from each of the sensors is used to determine the position of input member 20.

Figure 2:
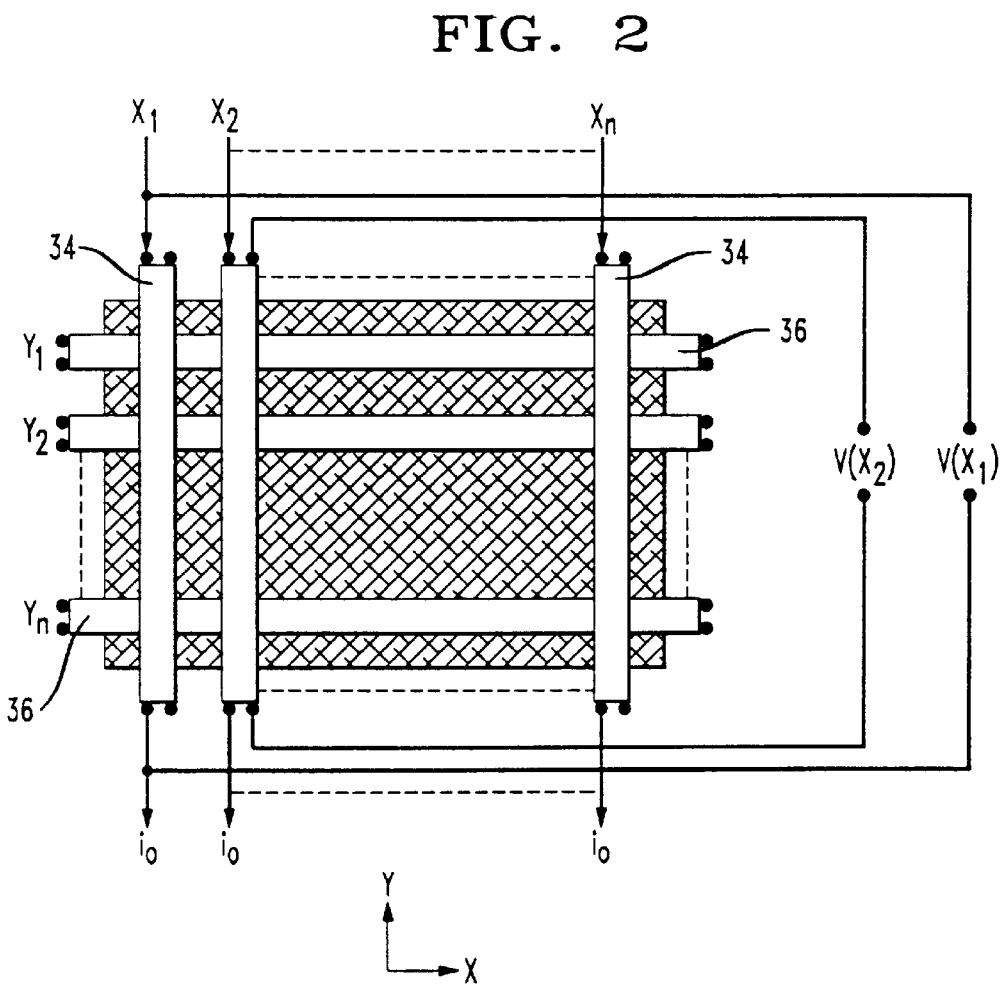
FIG. 2 is a schematic representation of a two-dimensional position-sensing array according to a further embodiment of the present invention.

FIG. 2 depicts a sensor array for measuring x-y position according to a further embodiment of the present invention. Such x-y position sensing systems are incorporated into numerous devices, such as graphics tablets. Sensors 30 are formed into strips 34, 36 and arrayed in a grid pattern. Strips 34 are arrayed parallel to one another in a vertical row for determining position in the x-direction while strips 36 are arrayed parallel to one another in a horizontal row approximately perpendicular to vertical strips 34 for determining position in the y-direction. Strips 34 and strips 36 are separated from each other by an insulating layer (not shown).

As illustrated in the FIG. 2, a known current, $i_o$, is input to strips 34. Likewise, a known current is passed through strips 36 (not shown). Although large input currents desirably produce a greater voltage drop, exemplary current levels are typically less than 50 mA, more particularly, less than 10 mA, and even more particularly, less than 5 mA. Low current consumes less power, a desirable feature for telecommunications graphics tablets powered by telephone lines. The current input is either DC or AC in a frequency range of 1 Hz to 100 MHz. To further reduce power consumption, the current may be pulsed with a small residence time per strip at a scanning rate higher than the speed of the information input member. For example, the input current can be sent as a pulse or train of pulses for less than 1% of the time or less than 0.1% of the time.

The voltage drop $V(X_1)$, $V(X_2)$, etc., is measured across each of strips 34 to detect the position of the information input member member 20. Each strip near the input member will experience the magnetic field of the input member magnet and experience a change in resistance based on the proximity to the field. Consequently, a $\Delta V$ change is measured for each strip. The $\Delta V$ signals from sensor strips 34 decrease symmetrically as a function of distance in the x-direction from the magnet (similarly, in the y-direction). The density of strips 34 in the array in combination with the influence range of the magnetic field from the information input member are selected such that plural sensing strips experience a resistance change for each movement of the input member. The use of plural sensing strips serves to multiply check the position of the input member.

Figure 3:
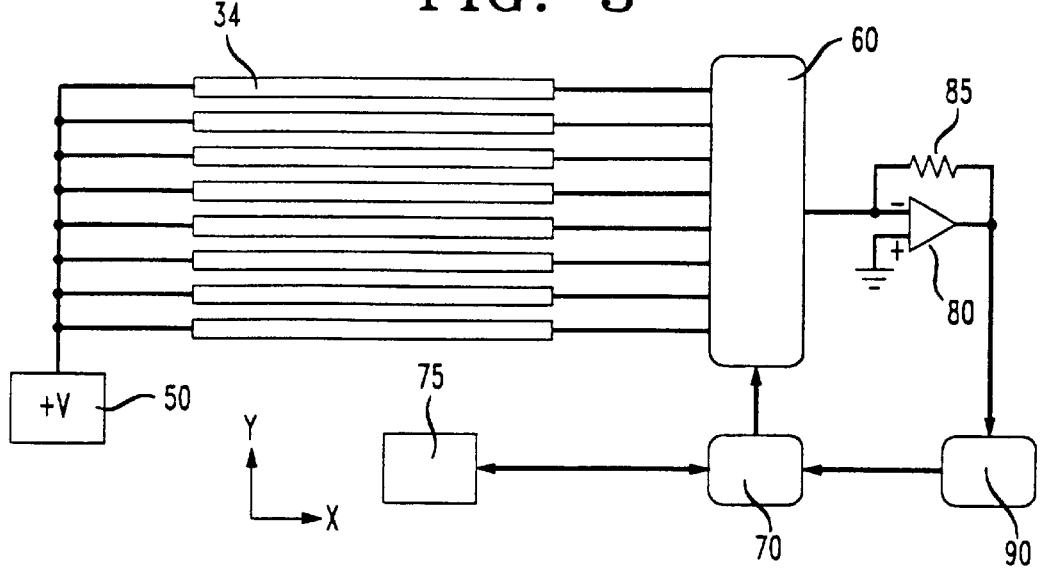
FIG. 3 is a schematic representation of a circuit for determining position from measured sensor signals.

FIG. 3 schematically depicts a circuit for determining position from measured sensor signals. N strips 34 incorporating magnetoresistive materials form an array for measuring input member position in the y-direction, as in FIG. 2. For a strip-to-strip spacing of s, the location of each strip is expressed in terms of s. The first strip is zero, the next is s, followed by 2s . . . (N-1)s. One end of each of strips 34 is connected to voltage source 50. The other end of each strip connects to a node of one of N analog multiplexers 60. Digital controller 70 selects a strip output to be sampled. The output signal from that strip is fed to the input node of amplifier 80 via multiplexer 60. Feedback resistor 85 is positioned in parallel with amplifier 80. Analog to digital converter 90 converts the amplifier output signal to digital form where it is processed by digital controller 70. Digital controller is operated through the main processor, 75.

To determine position in the y-direction, the resistance of each strip is initially measured in the absence of any field from the magnetic information input member. The strip resistance is linearly related to the amplifier output voltage by $$V_{out} = -V \frac{\text{(feedback resistance)}}{\text{(strip resistance)}}.$$

The zero field resistance measurements of the strips establish a set of base values which are subtracted from the resistance measurements of the strips in the presence of the magnetic information input member.

System processor 75 signals controller 70 which selects the strips in order through multiplexer 60 and reads the signal from analog-to-digital converter 90. From each signal, the resistance is calculated, and the zero field base resistance is subtracted. Position in the y-direction is the centroid of the resistance measurements determined by:

$$y = \frac{\sum_{i=0}^{i=N-1} i \cdot s \cdot R_{i \cdot s}}{\sum_{i=0}^{i=N-1} R_{i \cdot s}}$$

The one-dimensional circuit of FIG. 3 can be replicated to perform position measurements for the x-direction sensor array. Alternatively, a larger multiplexer is employed to connect both the x and y strips to a single circuit. Using the circuit of FIG. 3, individual measurements can be made in approximately 3 microseconds. For an 8-½×11 inch graphics tablet, approximately 200 samples/second can be made, sufficiently frequent to accurately track writing.

The circuit for determining position is also used to determine when information is being input. For a graphics tablet application, this process is referred to as "inking", i.e., a magnetic pen is considered to be "writing" only when touching, or nearly touching, the tablet surface. For the above circuit, the denominator of the above centroid equation is used to calculate the sum of resistance changes. When this sum reaches a threshold "inking" value, the numerator is also calculated and position is recorded. If the value is below the threshold value, then inking is deemed to not have occurred and position is not calculated. This threshold calculation protects the system from unwanted writing information being inadvertently entered.

Figure 4:
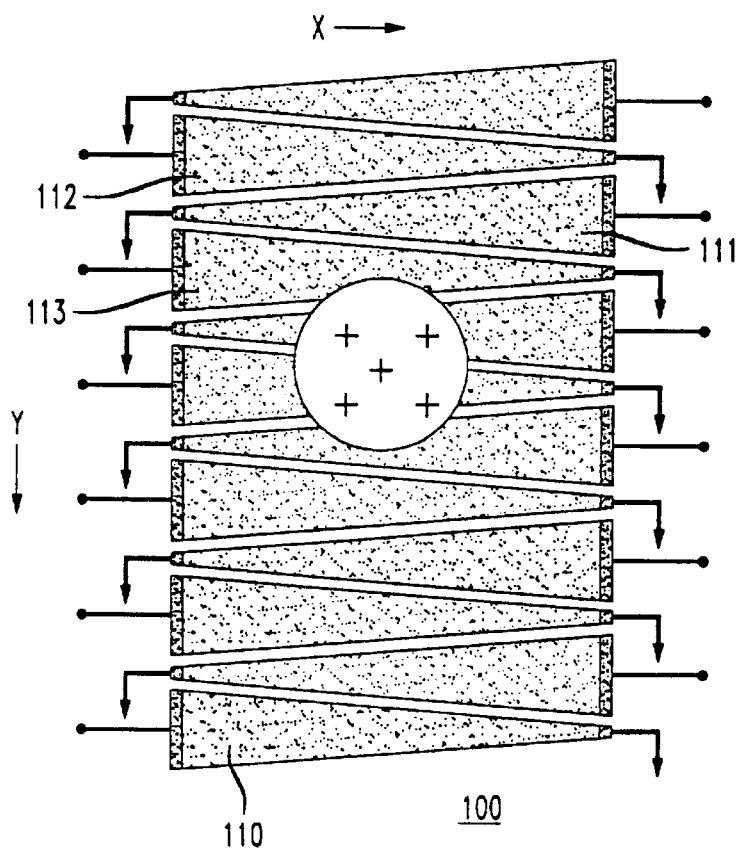
FIG. 4 is a schematic representation of a two-dimensional position-sensing array according to a further embodiment of the present invention.

FIG. 4 illustrates a two-dimensional position sensing system according to a further embodiment of the present invention which employs a single array of sensors. The array 100 is formed from a pattern of interleaved planar triangles 110. The triangles are oriented within the array such that the triangle width varies with position in the x-direction. As a magnetic information input member scans array 100, the resistance of a particular triangle 110 changes in the x-direction due to the change in triangle width as a function of position in the x-direction. Adjacent triangles experience a resistance change for that same movement in the x-direction opposite in kind to that of the first strip. For example, as distance in the x-direction increases along triangle 111 in FIG. 4, the change in resistance decreases since the width of triangle 111 increases along x. Adjacent triangles 112 and 113 experience a corresponding increase in the magnitude of resistance change as position increases with x. The combined sensor signal information from plural triangular sensors gives both x and y coordinates without the need for an additional sensor array, advantageously permitting use of a single sensor material layer.

To determine position for the sensor array of FIG. 4, the circuit of FIG. 3 is used. The y-position is calculated through determination of the centroid, as in the previous embodiment. For determination of the x-position, the y-direction result is used to select those strips experiencing the information input member magnetic field. For a pair of such strips, movement of the pen causes a change in resistance opposite in kind for each adjacent triangle, as described above. Since this effect is linear with the input member's position along the strip, the differences of offset corrected resistances from triangles of a first orientation to triangles of the opposite orientation indicates the x-position of the input member.

Magnetoresistive members 32 employed in sensors 30 and strips 34 and 36 are selected from those magnetoresistive materials having high MR ratios and adequate resistivities. Exemplary magnetoresistive materials have MR ratios of at least 50% at a magnetic field strength of 6 Tesla and resistivities of at least 0.2 milliohm/cm, preferably at least 1 milliohm/cm. Magnetoresistive materials which have these properties include compounds of the form $A_w B_x C_y O_z$ where A is selected from one or more rare earth elements (La, Y, Ce, Nd, Sm, Eu, Tb, Dy, Ho, Er, Tm, Yb, and Lu), B is selected from one or more Group IIa elements of the periodic table (Mg, Ca, Sr, and Ba) and Pb or Cd, and C is selected from Cr, Mn, Fe, and Co. Exemplary stoichiometries include $0.4 \leq w \leq 0.9$, $0.1 \leq x \leq 0.6$, $0.7 \leq y \leq 1.5$, $2.5 \leq z \leq 3.5$, with $0.5 \leq w \leq 0.8$, $0.15 \leq x \leq 0.5$, $0.8 \leq y \leq 1.2$, and $2.7 \leq z \leq 3.3$ being preferable. Compositions in which A is La, B is Ca, Sr, Ba, Pb, or mixtures thereof, and C is Mn are exemplary magnetoresistive materials. The use of these magnetoresistive materials which display large magnetoresistances in combination with high resistances as compared to metallic magnetoresistive materials creates relatively large changes in output voltage signals $\Delta V$ in response to resistance changes caused by an applied magnetic field. Advantageously, this creates a high sensing voltage even for relatively small input current levels. Further, the magnetoresistive materials described above are essentially isotropic in terms of magnetic field orientation when the demagnetizing factor is taken into consideration. This permits the field created by input member magnet 22 to be oriented in any direction, transverse, horizontal, or vertical, relative to sensors 20.

Lanthanum-manganite materials having high MR ratios are further described in co-pending U.S. patent applications Ser. Nos. 08/154,766 to Jin et al. filed Nov. 18, 1993, 08/176,366 to Jin et al. filed Dec. 30, 1993, and 08/187,668 to Jin et al. filed Jan. 26, 1994, the disclosures of which are incorporated by reference herein.

The above magnetoresistive materials can be formed as epitaxial or non-epitaxial layers on substrates through a variety of thin or thick film fabrication techniques including sputtering, reactive sputtering, laser ablation, evaporation, reactive evaporation, molecular beam epitaxy, plasma spraying, electroless plating, electrolytic plating, chemical vapor deposition, and screen printing. When using a thick film technique in which the magnetoresistive material is deposited as a paste formed from particulate material, a fusion step, such as sintering, is used to unite the particulates and create a coherent layer. The above methods are used to deposit the oxide directly or, alternatively, the non-oxygen members of the magnetoresistive material which are then oxidized to create the oxide material. Such oxidation is performed through various techniques including thermal oxidation and plasma oxidation.

When formed as thin films, the magnetoresistive materials are deposited on a variety of substrates including, but not limited to LaAlO$_3$, strontium titanate (SrTiO$_3$), magnesium oxide (MgO), silicon, aluminum oxide (Al$_2$O$_3$), and glass. Thin films of the above magnetoresistive materials can be made transparent or semi-transparent by reducing the thickness to below approximately 500 Angstroms. Transparent films are desirable for use in some graphics tablets or CRTs which allow hand drawing duplication of figures displayed beneath the tablet surface or CRT to generate digital electronic images.

Use of the above magnetoresistive films provides position sensors whose change in voltage, $\Delta V$, in response to an applied magnetic field, is essentially independent of the sweep rate of the magnetic information input member. As an example, the change in the in-plane sweep-rate of a hand-held input member incorporating a magnetic element from 1.2 cm/sec to 12 cm/sec produced no measurable difference in the $\Delta V$ of the magnetoresistive sensor. The independence of $\Delta V$ from the rate at which the magnetic field is brought into sensor proximity advantageously ensures reliability of position sensing. When the sensing signal is dependent upon production speed, as in the case of inductive sensing of a moving magnetic pen using $d\phi/dt$ voltage generation, erroneous position sensing can occur.

Position sensing using an information input member having a magnetic element is demonstrated in the following Examples:

EXAMPLE 1

Magnetoresistive Sensing

A La-Ca-Sr-Mn-oxide film with approximately 1000 angstrom thickness was prepared by pulsed laser deposition using a target with a nominal composition of La$_{0.55}$Ca$_{0.25}$Sr$_{0.08}$MnO$_x$ where x is approximately 3. A 100 millitorr partial pressure oxygen atmosphere was used during deposition with a substrate temperature of about 700° C. A (100) single crystal LaAlO$_3$ substrate was used to promote epitaxial film growth. A sample of 3×1.5 mm was cut and heat-treated at 950° C. for 3 hours in a 3 atmosphere oxygen environment.

Electrical resistance of the film as measured by a four-point probe technique was on the order of 280 ohm (1.4 milliohm/cm). The sample was then used as a magnetoresistive sensor as in the configuration of FIG. 1. A current was supplied to the magnetoresistive sample to produce a voltage drop of 280 mV. A permanent magnet rod of Nd-Fe-B in a hand-held pen such as information input member 20 was moved to within approximately 0.8 mm (corresponding to a magnetic field H on the order of 1300 Oe) of the magnetoresistive sample sensor. The change in the magnetic field strength resulted in a change in the voltage drop from 280 mV to 267 mV, a $\Delta V$ signal of 13 mV representing a 4.6% change in the voltage drop. When the magnet-containing pen was moved away from the sample, the voltage drop returned to 280 mV.

Figure 5:
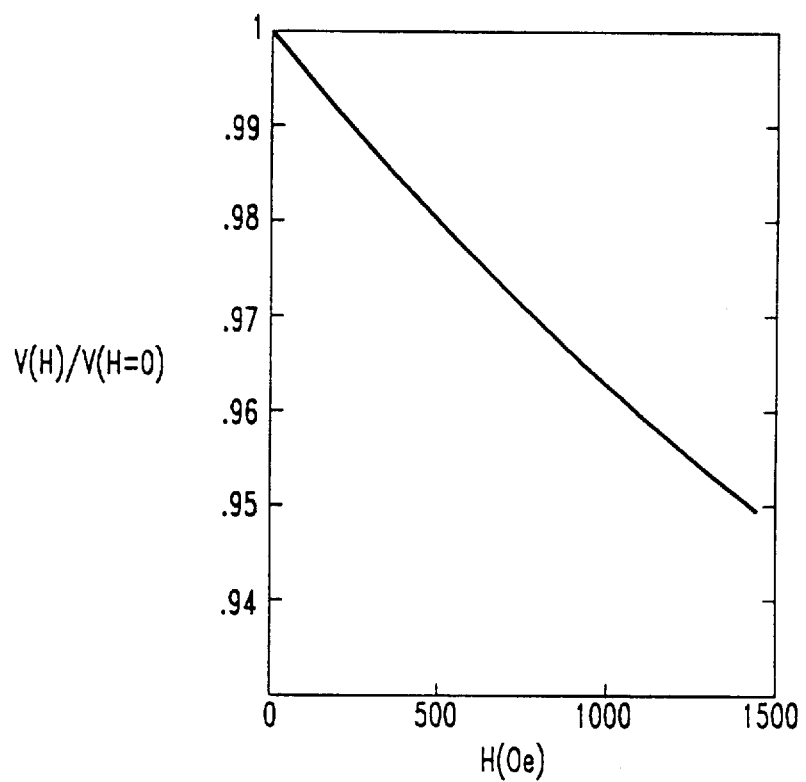
FIG. 5 is the voltage output signal of a lanthanum-calcium-strontium-manganese-oxide magnetoresistive position sensor as a function of an applied magnetic field.

The magnitude of the voltage output signal, $\Delta V$, corresponding to the change in resistance of the sensor, $\Delta R$, increases with increasing magnetic field on the magnetoresistive sample as illustrated in FIG. 5 which plots $\Delta V$, i.e., the voltage in the presence of a magnetic field divided by the voltage in the absence of a magnetic field as a function of magnetic field strength.

EXAMPLE 2

Independence of Position Sensing on Input Member Movement Direction and Speed A La-Ca-Mn-oxide film of about 1000 angstrom thickness was prepared by pulsed laser deposition using a target having a nominal composition of La$_{0.65}$Ca$_{0.32}$MnO$_x$ where x is approximately 3. The oxygen partial pressure during deposition was about 100 mTorr and the substrate temperature was about 700° C. A single crystal LaAlO$_3$ plate having (100) orientation and a 3 cm$^2$ surface area was employed as the substrate.

From the deposited film, a 4×2 mm sample was cut and heat-treated in an oxygen atmosphere at 900° C. for 3 hours. Following heat-treatment, electrical properties of the film were measured through a four-point technique. Four contact leads were soldered to the sample, the two voltage-measuring inner contacts being separated by approximately 3 mm.

A La-Ca-Mn-O film with about 1000 Å thickness was prepared by pulsed laser deposition using a target with a nominal composition of La$_{0.65}$Ca$_{0.32}$MnO$_x$ at about 100 millitorr oxygen partial pressure and a substrate temperature of about 700° C. A single crystal LaAlO$_3$ substrate with (100) orientation and about 3 cm square size was used. The deposited film was cut to a single size of about 4 mm length and about 2 mm width and heat treated at 900° C./3 h in an oxygen atmosphere. Four contact leads were soldered on to it for four point measurement of electrical properties. The two inner contacts for voltage measurement were separated by approximately 3 mm. The magnetic sensing experiment was performed as in Example 1 but at a temperature of 77 K. The sensor film was immersed in liquid nitrogen while supplying a constant DC current of 1 mA. The electrical resistance of the film at the temperature of 77 K was about 15.9 K$\Omega$ (corresponding to a resistivity of 106 milliohm-cm).

Two magnetoresistive sensor elements were placed approximately 1.25 cm apart. The magnetic information input member employed a small permanent magnet (Nd-Fe-B type) at one end to provide a vertical magnetic field of ~1000 Oe at a distance of about 1 mm. The magnetic input member was moved sideways maintaining a constant height of approximately 1 mm. When the input member was far away (>3 cm) from the sensor, the measured voltage output was 15.90 volts. When the magnetic input member was brought close to the sensor, the voltage output measured 14.60 volts, an induced $\Delta V$ of 1.30 V (about 8% change). The measured $\Delta V$ signal remained at about this level as this procedure was repeated for various speeds of the input member, demonstrating that the voltage change induced by the resistance change of the magnetoresistive material was essentially independent of the pen movement direction or the pen movement speed.

While the position sensing system of the present invention has been described above with respect to its application in graphics tablets, it is appreciated that the position sensing system is suitably employed in numerous sensing and control situations. Applications include, but are not limited to, computer peripherals such as mouse and mouse pads, in which the mouse includes a magnetic member and the mouse pad includes magnetoresistive sensors or in which a rolling mouse magnetic element is surrounded by a plurality of magnetoresistive sensors. Additionally, the position sensing system of the present invention can be incorporated in a telecommunications network in which the change in voltage from the magnetoresistive sensors is sent via a transmission line to a receiving member which processes the signal to convey the information generated by the information input member. Numerous geometries of information input member(s) and sensing element(s) of the invention can be used including planar configurations, as described above, and three dimensional configurations in which sensing elements are positioned within hollow cylinders or cubes having information input members positionable therein. Accordingly, modifications and changes to the invention, such as those indicated above but not limited thereto, are considered to be within the scope of the claims.

We claim:

1. A position-sensing system comprising:

an information input member, the information input member including a magnet;

at least one sensing element, the sensing element including a magnetoresistive material having a resistance which changes in response to the presence of a magnetic field;

wherein the magnetoresistive material includes a compound of the form $A_wB_xC_yO_z$ where A is selected from one or more of La, Y, Ce, Nd, Sm, Eu, Tb, Dy, Ho, Er, Tm, Yb, and Lu, B is selected from one or more of Mg, Ca, Sr, Pb, and Cd, and C is selected from Cr, Mn, Fe, and Co and w is 0.4 to 0.9, x is 0.1 to 0.6, y is 0.7 to 1.5, and z is 2.5 to 3.5.

2. A position-sensing system according to claim 1 further comprising current-applying elements for applying D.C. current to the at least one sensing element.

3. A position-sensing system according to claim 1 further comprising current applying elements for applying A.C. current to the at least one sensing element.

4. A position-sensing system according to claim 1 wherein the magnetoresistive material is transparent.

5. An x-y position-sensing system comprising:

an information input member, the information input member including a magnet;

an array of position-sensing elements, the array including a first set of sensing strips arranged in parallel lines to measure position of the information input member in a first direction, each of the sensing strips incorporating a magnetoresistive material, and a second set of sensing strips arranged in parallel lines to measure position of the information input member in a second direction, each of the second set of sensing strips incorporating a magnetoresistive material, the second set of sensing strips positioned substantially perpendicular to said first set of sensing strips, wherein the magnetoresistive material includes a compound of the form $A_wB_xC_yO_z$ where A is selected from one or more of La, Y, Ce, Nd, Sm, Eu, Tb, Dy, Ho, Er, Tm, Yb, and Lu, B is selected from one or of Mg, Ca, Sr, Pb, and Cd, and C is selected from Cr, Mn, Fe, and Co and w is 0.4 to 0.9, x is 0.1 to 0.6, y is 0.7 to 1.5, and z is 2.5 to 3.5.

6. The x-y position-sensing system of claim 5 further comprising a power source connected to each of the sensing strips.

7. The x-y position-sensing system of claim 5 further comprising a voltage-measuring member connected to each of the sensing strips.

8. A graphics tablet incorporating the x-y position-sensing system of claim 5.

9. An x-y position-sensing system comprising:

an information input member, the information input member including a magnet; and a single array of position-sensing elements comprising an interleaving pattern of planar triangles, the triangles oriented such that for first and second adjacent triangles, the width of the first triangle linearly increases with position in a first direction while the width of the second triangle linearly decreases with position in a first direction, each of the position-sensing elements incorporating a magnetoresistive material, wherein the magnetoresistive material includes a compound of the form $A_wB_xC_yO_z$ where A is selected from one or more of La, Y, Ce, Nd, Sm, Eu, Tb, Dy, Ho, Er, Tm, Yb, and Lu, B is selected from one or of Mg, Ca, Sr, Pb, and Cd, and C is selected from Cr, Mn, Fe, and Co and w is 0.4 to 0.9, x is 0.1 to 0.6, y is 0.7 to 1.5, and z is 2.5 to 3.5.

10. The x-y position-sensing system of claim 9 further comprising a power source connected to each of the position-sensing elements.

11. The x-y position-sensing system of claim 9 further comprising a voltage-measuring member connected to each of the position-sensing elements.

12. A position-sensing system comprising:

an information input member including a magnetic field-producing element for producing a first magnetic field;

an information deletion member including a magnetic field-producing element for producing a second magnetic field, the second magnetic field differing from the first magnetic field in frequency, orientation, or waveform; and at least one sensor, the sensor including a magnetoresistive material having a resistance which changes in response to the presence of a magnetic field, wherein the magnetoresistive material includes a compound of the form $A_wB_xC_yO_z$ where A is selected from one or more of La, Y, Ce, Nd, Sm, Eu, Tb, Dy, Ho, Er, Tm, Yb, and Lu, B is selected from one or of Mg, Ca, Sr, Pb, and Cd, and C is selected from Cr, Mn, Fe, and Co and w is 0.4 to 0.9, x is 0.1 to 0.6, y is 0.7 to 1.5, and z is 2.5 to 3.5.

13. A position-sensing system according to claim 12 wherein the information input member and the information deletion member are located on opposite ends of a hand-held stylus.

14. A position-sensing system according to claim 12 further comprising current-applying elements for applying A.C. or D.C. current to the at least one sensor.

* * * * *